United States Patent [19]

Brooks

[11] Patent Number: 4,617,679

[45] Date of Patent: Oct. 14, 1986

[54] DIGITAL PHASE LOCK LOOP CIRCUIT

[75] Inventor: Phillip L. Brooks, Northborough, Mass.

[73] Assignee: NEC Electronics U.S.A., Inc., San Mateo, Calif.

[21] Appl. No.: 534,058

[22] Filed: Sep. 20, 1983

[51] Int. Cl.[4] ............................................. H03L 7/08
[52] U.S. Cl. .................................... 375/119; 375/120; 307/514; 307/262; 331/1 A
[58] Field of Search ....................... 375/118, 119, 120; 307/262, 514, 516; 328/133, 134; 329/124; 331/1 A

[56] References Cited

U.S. PATENT DOCUMENTS

| | | | |
|---|---|---|---|
| 3,961,138 | 6/1976 | Fellinger | 375/111 |
| 4,029,905 | 6/1977 | Abraham | 375/120 |
| 4,151,485 | 4/1979 | LaFratta | 375/120 |
| 4,189,622 | 2/1980 | Foshee | 375/111 |
| 4,218,771 | 8/1980 | Hogge, Jr. | 375/120 |
| 4,302,831 | 11/1981 | Zemanek | 375/119 |
| 4,386,323 | 5/1983 | Jansen | 375/119 |

Primary Examiner—Robert L. Griffin
Assistant Examiner—Raymond C. Glenny
Attorney, Agent, or Firm—Sughrue, Mion, Zinn, Macpeak, and Seas

[57] ABSTRACT

A digital phase lock loop (PLL) circuit adaptable to a hard disk drive. The PLL operable at a high speed comprises a pulse shaper for subjecting raw data pulses from the disk drive to waveform-shaping, a phase comparator for producing a phase control pulse on the basis of the relative positions of a delayed reference clock (VCLK) pulse and each of said waveform-shaped data pulses from the shaper, and a phase shifter for generating the VCLK pulse in response to the phase control pulse.

11 Claims, 6 Drawing Figures

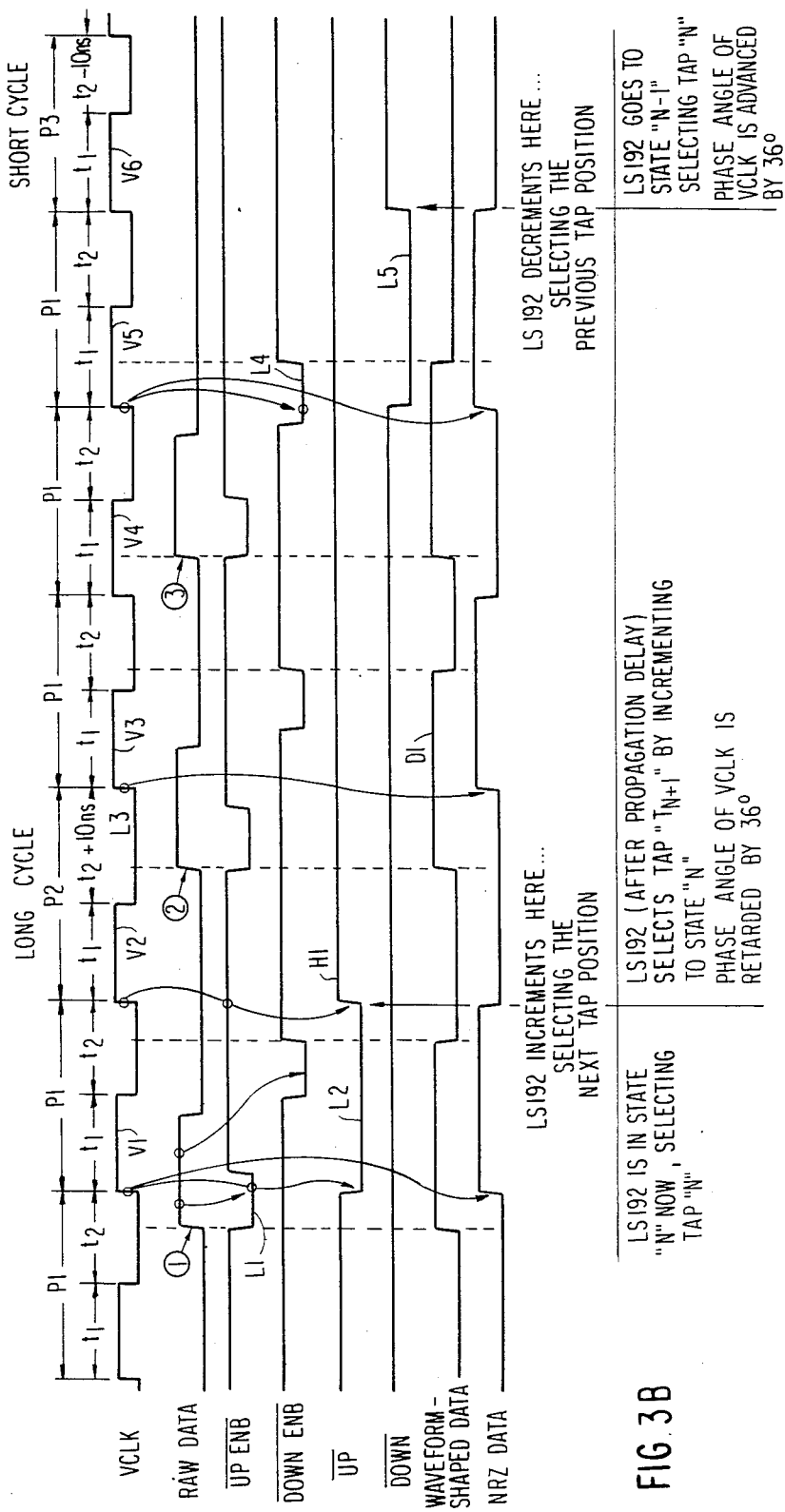

DIGITAL PHASE LOCK LOOP CIRCUIT

BACKGROUND OF THE INVENTION

The present invention relates to a digital phase lock loop (PLL) circuit operable at high speed and, more particularly, to a digital PLL circuit for use in a hard disk drive.

It is known to use a PLL circuit to read out data from a hard disk drive by regenerating clock pulses synchronized with the reproduced data. PLL circuits for achieving this purpose have conventionally been constructed in analog form. Referring to FIG. 1, a typical PLL circuit of this type would include a sync field detector 1, a reference oscillator 2, a phase comparator 3, an error amplifier 4, a low pass filter 5, a voltage controlled oscillator (VCO) 6, and an address mark detector 7. The VCO generates a clock pulse having a frequency and phase synchronized with the data. The comparator generates pulses corresponding to the difference in the relative position of the data and the VCO timing clock pulse. The output of the comparator represents the "error signal" for controlling the PLL loop. The error amplifier converts the TTL (transistor-transistor logic) pulses from the phase comparator into constant current pulses and isolates any logic noise that might be present in the phase comparator outputs. The low pass filter arranged between the error amplifier and the VCO serves to reject certain frequency components while passing others, so that the high frequency jitter caused by various magnetic recording phenomena can be averaged or rejected.

The sync field detector prevents the VCO from slewing to a high frequency and being locked to a harmonic of the basic read/write frequency for the disk data. More specifically, when data is written to a disk there are areas on the disk that will contain invalid high frequency bursts, or "write glitches" due to a WRITE GATE being asserted and negated, data being recorded with a slightly different phase, a write current of an improper value at the beginning or end of the WRITE GATE, or for some other reason. If the phase comparator 3 is permitted to control the PLL loop during periods of time when these "glitches" are present, the VCO may be caused to slew to a high frequency and the VCO may then become locked to a higher harmonic when the normal data subsequently returns. To prevent this, the sync field detector 1 first maintains the VCO frequency locked to a desired frequency by passing a reference signal of predetermined frequency from the reference clock generator 2, e.g., 10 MHz, to the phase comparator 3, and the data is only provided to the phase comparator 3 after a sync field is detected.

In a typical Winchester drive data format, a sync field is provided in the form of an all-zero pattern of a predetermined number of bits recorded in front of each of the ID FIELD and the DATA FIELD and an address mark is recorded after each sync field but before the ID field or data field. When the pattern of 16 zero bits is recognized by the field detecting means, the switch 9 will be changed to select the reproduced data for provision to the phase comparator 3. The address mark detector 7 then examines the output of the switch 9 and provides a reset signal to the field detecting means 8 if an address mark is not detected within some predetermined period of time. The search for the sync field will then begin over again. Assuming that the address mark is detected, the reproduced data continues to be selected for a predetermined period of time long enough to detect the ID or data information. In this way, the reproduced data is not selected to control the PLL during the gap periods between fields when the WRITE GATE is turned on and off.

A great deal of effort is required in the design of the type of PLL circuit illustrated in FIG. 1. If different types of drives are used or if the data rate changes, an excessive amount of calculation and experimentation is required to derive new filter constants. Even if a PLL design is copied from a recommended circuit, there is no guarantee that it will perform satisfactorily. There are a great many variations in components from different manufacturers and in PC board design. In addition, each PLL circuit must be verified for performance and must be adjusted during testing by a reasonably qualified technician.

Further disadvantages of the conventional PLL circuit are that the loop filter 5 is necessary to remove logic noise which may be present in the output of the phase comparator, and the RC or LC components of the VCO must be carefully selected and adjusted, and even so the VCO will be extremely sensitive to logic noise.

If all conditions are ideal, the analog PLL can be made to provide excellent performance equal to or exceeding the drive's specifications, but ideal conditions are obviously very difficult to achieve.

SUMMARY OF THE INVENTION

An object of the invention is to provide a novel, simplified digital PLL circuit free from the above-mentioned various disadvantages in the conventional analog PLL circuit.

According to one aspect of the invention, there is provided a digital PLL circuit comprising a reference clock pulse generator whose clock frequency is higher than the rate of raw data pulses received from an external device; a pulse shaper for subjecting each of said data pulses to waveform-shaping to obtain waveform-shaped pulses having pulse widths approximately equal to one clock period of said reference clock pulses; means for producing a phase control pulse on the basis of the relative positions of a delayed reference clock pulse and each of said waveform-shaped data pulses; and means for generating said delayed reference clock pulse in response to said phase control pulse.

In the preferred embodiment, the pulse-shaping device generates two pulses in addition to the waveform-shaped data. A first pulse has a duration covering approximately the first 30 percent of the data period, and a second pulse covers approximately the last 30 percent of the data period. When the leading edge of the clock falls within the center 40 percent of the data period, the clock timing is considered to be correct and no action is taken. When the leading edge of a clock signal occurs during either one of the first or second signals, a delay or advance signal is generated, as appropriate, and the generated delay or advance signal is provided to an up/down counter. The counter value then changes accordingly, and the counter output is used to select from a number of phase-delayed versions of the clock signal, with the selected clock signal being provided as the phase-corrected clock signal.

BRIEF DESCRIPTION OF THE DRAWINGS

The above and further objects, features and advantages of the invention will become more evident from the following detailed description of the invention taken in conjunction with the accompanying drawings, wherein:

FIGS. 3A and 3B are waveform diagrams for describing the present invention;

In the drawings, identical reference numerals denote the same structural elements.

DETAILED DESCRIPTION OF THE INVENTION

Figure 2:
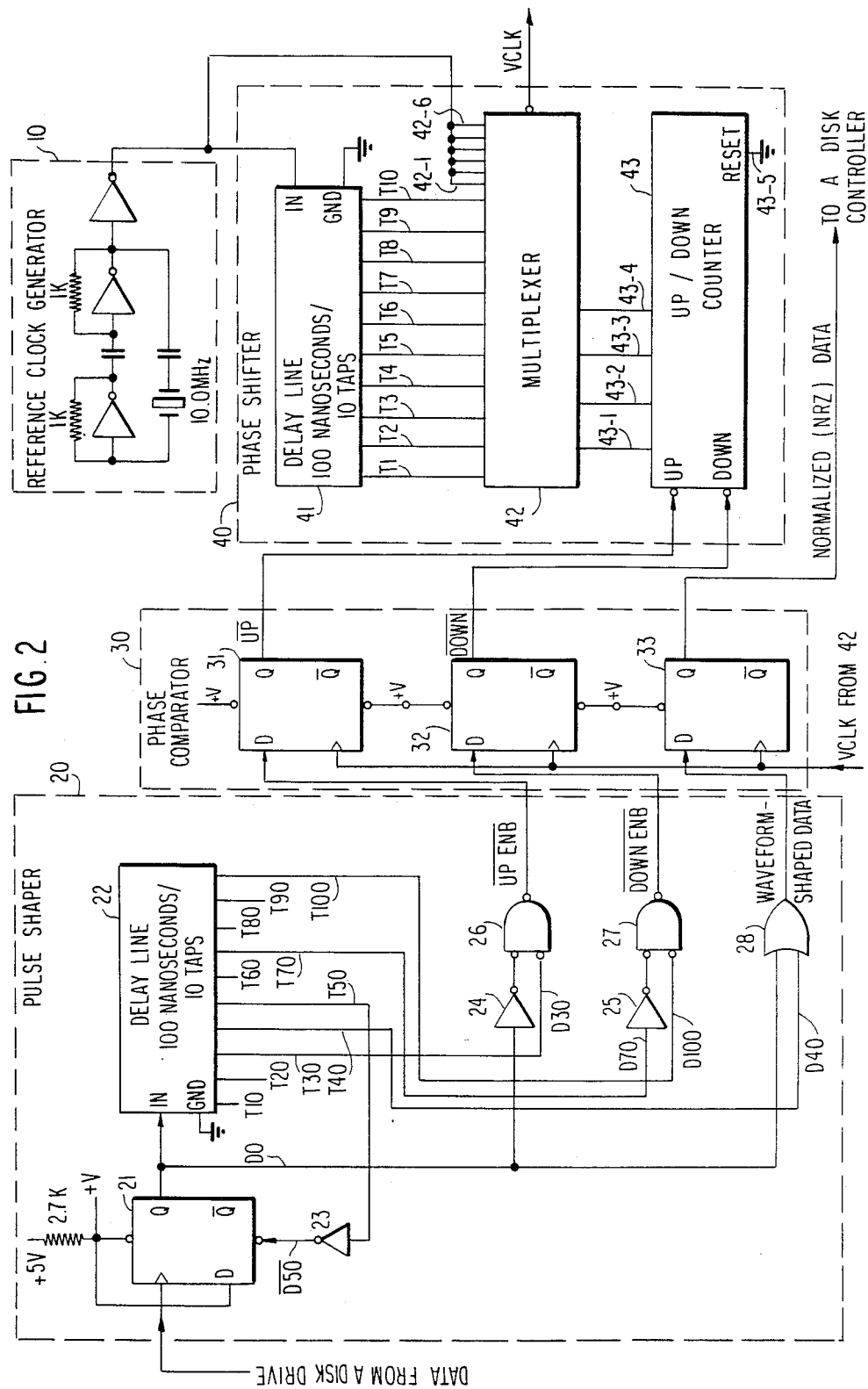
FIG. 2 is a diagram of one embodiment of the invention.

Referring to FIG. 2, one embodiment of the invention comprises a reference clock generator 10 whose clock frequency of, e.g., 10 MHz is selected to be twice the 5 MHz rate of raw data pulses reproduced from a disc drive (not shown), a pulse shaper 20 for subjecting the reproduced data pulses to waveform-shaping, a phase comparator 30 for producing a phase control pulse on the basis of the relative position of a correspondingly delayed reference clock (VCLK) pulse with respect to each of said waveform-shaped data pulses from the shaper 20, and a phase shifter 40 for generating said VCLK pulse in response to said phase control pulse.

More specifically, the pulse shaper 20 includes a D-type flip-flop 21; a delay line circuit 22 for providing a total of 100 nanoseconds delay selectable in 10 ns increments through 10 taps (T10, T20, ..., T100); inverters 23, 24, and 25, each of which has a gate delay; AND gates 26 and 27; and OR gate 28. Each circe marked at the input or output of the flip-flop, inverters and AND gates represents an inversion of a given input or output.

Figure 3A:
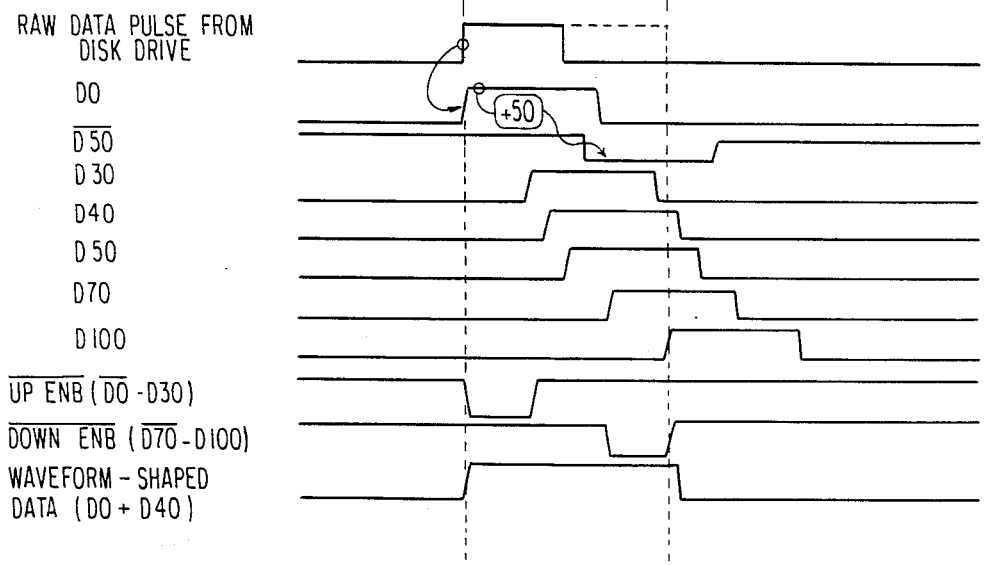

As shown in FIG. 3A, three signals, that is, $\overline{\text{UP ENB}}$, $\overline{\text{DOWN ENB}}$ and waveform-shaped data are produced through the AND gates 26 and 27 and OR gate 28, respectively. In the same drawing, D0, $\overline{\text{D50}}$, D30, D40, D50, D70 and D100 indicate outputs appearing at corresponding signal lines shown in FIG. 2.

Each of the three signals will be described in detail referring to FIGS. 2 and 3A.

The $\overline{\text{UP ENB}}$ signal is obtained as the inversion of a logical product ($\overline{\text{D0·D30}}$) whose pulse width is equal to, e.g., 30 percent of one reference clock period (CP) of 100 nanoseconds, assuming a low level during approximately the first 30 percent of the waveform-shaped data from the OR gate 28. $\overline{\text{DOWN ENB}}$ is the inversion of a logical product ($\overline{\text{D70·D100}}$) having a pulse width equal to 30 percent of one CP and assumes a low level during approximately the last 30 percent of the data from the gate 28. The waveform-shaped data having a pulse width substantially equal to one CP is generated as a logical sum (D10+D40) at the gate 28.

Referring now to FIG. 2, the digital phase comparator 30 includes two D-type flip-flops 31 and 32 for detecting the occurrence of the rising edge of the above-mentioned VCLK pulse during the low level period of either the $\overline{\text{UP ENB}}$ or $\overline{\text{DOWN ENB}}$ signals from the shaper 20, and a D-type flip-flop 33 for producing normalized data to be provided to a disk controller (not shown) which controls the data writing-in and reading-out operations for the disk drive and also communicates with a host computer (not shown). The timing relationship ensures that there will be only one of the flip-flops 31 and 32 set (i.e., have a low level Q output) at any given time. In contrast, the flip-flop 33 is always set in response to the waveform-shaped data from the gate 28. Each of the three flip-flops 31 to 33 is set for one VCLK period, because the next rising edge of the VCLK pulse will clear it.

The phase shifter 40 is constructed of a delay line circuit 41, a multiplexer 42 and an up/down counter 43. The delay line circuit 41 provides a total 100-nanosecond delay with 10 taps (T1,T2,..., T9,T10), each of which provides a relative delay increment of ten percent of the total delay, with the total delay being equal to the reference clock period. The up/down counter 43 generates a binary selection address to the multiplexer 42 so that one out of the ten taps of the delay line circuit 41 is selected to produce a reference clock pulse with the phase shifted correspondingly. More particularly, the counter 43 may be a conventional LS192 ring counter and will increment or decrement each time a positive-going transition occurs in the $\overline{\text{UP}}$ or $\overline{\text{DOWN}}$ signals, respectively. Each time the up/down counter 43 is incremented or decremented by the $\overline{\text{UP}}$ or $\overline{\text{DOWN}}$ signal from the flip-flop 31 or 32, an output signal different in phase by ten percent from the present phase angle is produced as a new VCLK pulse from the multiplexer 42. Consequently, the counter 43 has a 360° digital phase shift function in digital 10 percent increments. The counter 43 preferably has a maximum value of 9, starting from 0 and returning to 0 after it has reached 9. The multiplexer may be a 74150 multiplexer which selects one of the taps T1-T10 in accordance with the value on lines 43-1 through 43-4, but selects the signal on any one of lines 42-1 through 42-6 whenever the value in counter 43 exceeds its allowable maximum value of, e.g., "9". The relationship between the taps of the delay line circuit 41 which are selected, the values of the counter 43 and $\overline{\text{UP}}$ and $\overline{\text{DOWN}}$ signals from the flip-flops 31 and 32 can be more clearly understood by referring to the following Table which illustrates one hypothetical sequence of clock shifts.

TABLE

| Values of Counter 43 | 0 | 1 | 2 | 3 | 4 | 5 | 6 | 7 | 8 | 9 | 0 | 1 | 2 | 1 | 0 | 9 | 8 |
|---|---|---|---|---|---|---|---|---|---|---|---|---|---|---|---|---|---|
| Taps of Delay Lines 41 | T1 | T2 | T3 | T4 | T5 | T6 | T7 | T8 | T9 | T10 | T1 | T2 | T3 | T2 | T1 | T10 | T9 |
| UP/DOWN | A | A | A | A | A | A | A | A | A | A | A | R | R | R | R | R |   |

In the example sequence shown in this Table, a total of 360° phase shift is continuously performed using the $\overline{\text{UP}}$ signals from the flip-flop 31. In the above table, the symbol "A" represents a phase advancing function achieved by each $\overline{UP}$ signal and the symbol "R" represents a phase retarding function achieved by each $\overline{DOWN}$ signal.

Now, the operation of the embodiment will be described in detail referring to FIGS. 2 and 3B.

As shown in FIG. 3B, when a VCLK pulse V1 appears early with respect to raw data 1 from a hard disk drive (not shown), the leading edge of the pulse V1 is detected by the flip-flop 31 during the low level period L1 of the signal $\overline{UP\ ENB}$ from the shaper 20. As a result, a low level $\overline{UP}$ signal L2 is produced from the flip-flop 31 in synchronism with the rising edge of the pulse V1 and having a duration of one VCLK period P1 equal to $t_1+t_2$. With the leading edge of a VCLK pulse V2, the low level $\overline{UP}$ signal L2 becomes a high level H1. At this point, the up/down counter 43 shown in FIG. 2 increments by one to take a value, e.g., "5", increased by 1 from the previous value "4" so that the multiplexer 42 selects a corresponding tap (for example, T6) of the delay line circuit 41 to provide an additional phase shift of 36°. The period of a lower level L3 of a VCLK period P2 is consequently longer by 10 nanoseconds than that of the VCLK period P1, with the result that the occurrence of the next VCLK pulse will be slowed to thereby establish the correct timing relationship with raw data. In this manner, the phase angle of the reference clock pulse from the generator 10 is retarded by 36° to be produced as a VCLK pulse from the multiplexer 42.

It should be noted that the second half of the clock cycle is illustrated as being elongated in the waveform VCLK of FIG. 3B. This is due to the propagation time of the leading edge of the clock pulse VCLK from the output of multiplexer 42 through the flip-flops 31, 32 and counter 43 and the response time of multiplexer 42 to a change in the counter value. This propagation delay is typically greater than 50 nanoseconds, i.e., larger than the first half cycle of the signal VCLK.

Next, no clock adjustment action is taken in response to raw data 2 because this occurs during the center 40% of the data period and therefore the leading edge of a VCLK pulse V3 does not fall during the low level periods of either the $\overline{UP\ ENB}$ or $\overline{DOWN\ ENB}$ signals. In this case, the value of the counter 43 is kept at "5" and the multiplexer 42 automatically selects the same terminal as before (e.g. top T6).

In contrast, when raw data 3 arrives early with respect to a VCLK pulse V5 from the disk drive as shown in FIG. 3B, the leading edge of the VCLK pulse V5 falls within the low level period L4 of the $\overline{DOWN\ ENB}$ signal from the gate 27 of the shaper 20, and a corresponding DOWN signal is generated from the flip-flop 32 in the form of a low level signal L5. Consequently, the value in counter 43 is decreased by "1" to a value of "4", so that the multiplexer 42 selects a corresponding tap T5 of the delay line circuit 41 to advance the clock by ten percent (10 nanoseconds) with respect to the clock previously selected from tap T6. As a result, the next VCLK period P3 is shortened by 10 nanoseconds as compared with P1, so that the desired timing relationship may be established between the next VCLK pulse and the raw data.

Figure 1:
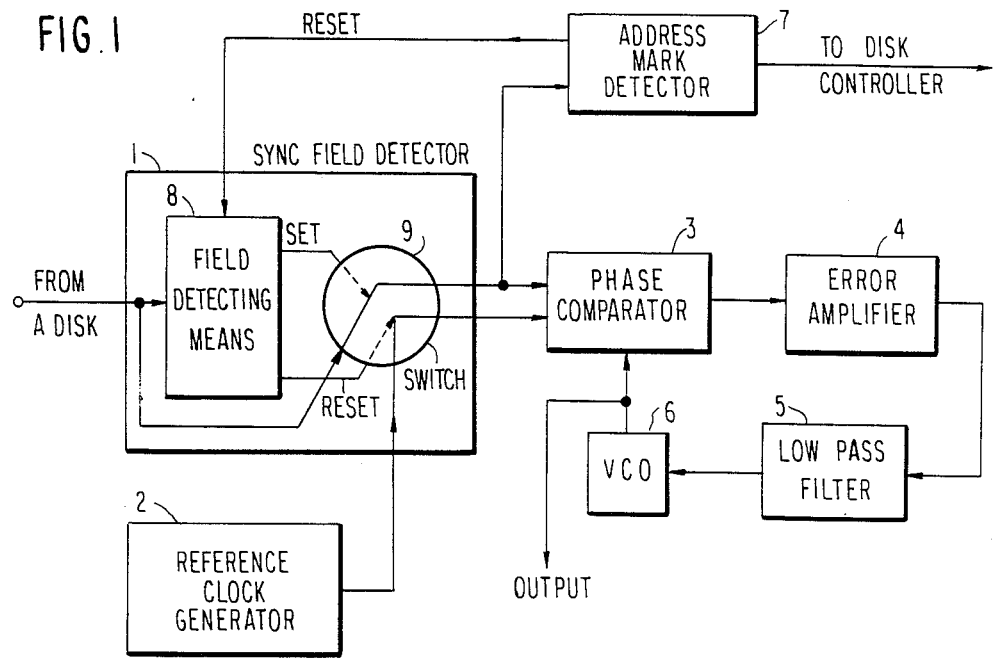
FIG. 1 is a block diagram of a conventional analog PLL circuit.

As has been discussed above, the present invention allows phase timing correction in digital form to overcome the above-mentioned disadvantages inherent in the prior art analog PLL circuit shown in FIG. 1.

Figure 4A:
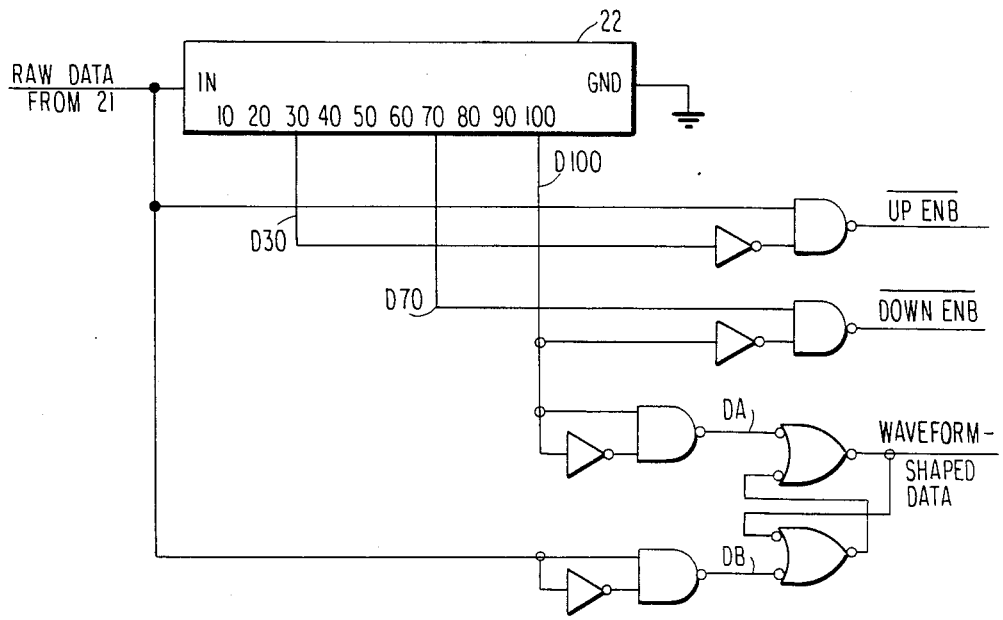
FIG. 4A shows a circuit diagram of another example of a pulse shaper of FIG. 2.
Figure 4B:
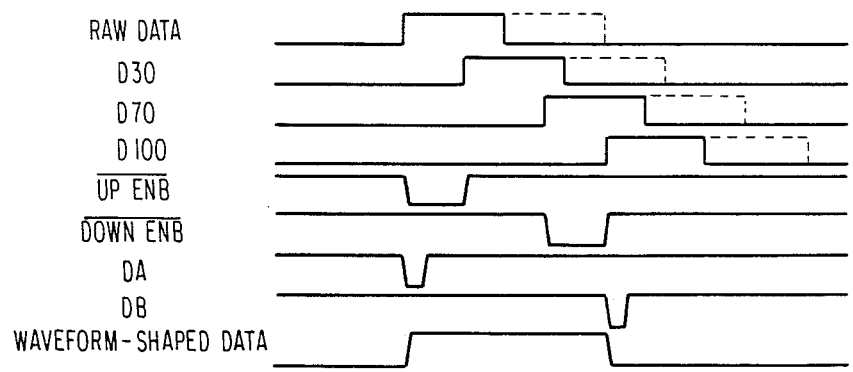
FIG. 4B is a waveform diagram for describing the example of FIG. 4A.

Parts of the system other than the flip-flop 21 of the pulse shaper 20 may be replaced by the circuit shown in FIG. 4A. In this case, the timing relationship among the $\overline{UP\ ENB}$, $\overline{DOWN\ ENB}$ and waveform-shaped data is illustrated in FIG. 4B.

It is to be noted that a reset terminal 43-5 of the counter 43 is grounded so as not to stop the operation of the counter 43. Also, each of the terminals 42-1 ... 42-6 of the multiplexer 42 is used to receive an input reference clock from the generator 10 directly without providing any delay. In this respect, any one of the terminals 42-1 ... 42-6 can be used to provide an undelayed clock signal when the value of the counter 43 erroneously takes a value larger than 9. For example, if on power-up the counter 43 erroneously assumes a value greater than "9", the counter value must be decreased to return the system to stable operation. Accordingly, the undelayed clock signal is selected as VCLK and this will result in a continuous stream of $\overline{UP}$ or $\overline{DOWN}$ signals to the counter 43 until the count value returns to its permitted range.

It should be noted that, while the digital PLL of this invention does not have to be told to start and stop selection of the reproduced data as in the system of FIG. 1 and for that reason does not require interaction with the address mark detector, the address mark detector remains in the overall system for use in data separation. It is not illustrated in FIG. 3 since it does not affect the operation of the PLL of this invention.

Many other modifications and alternatives to the embodiment can be easily made within the scope of the invention defined in the appended claims.

I claim:

1. A circuit for producing a sampling clock signal for sampling an input data pulse signal, comprising:
   a reference clock pulse generator generating a reference clock pulse signal;
   first means responsive to a phase control signal for producing a phase-shifted reference clock signal from said reference clock pulse signal to obtain a sampling clock signal;
   second means responsive to an input data pulse signal for producing a first comparison signal only during a first interval within each one bit period of said input data pulse signal;
   third means responsive to said input data pulse signal for producing a second comparison signal only during a second interval within each one bit period of said input data pulse signal, said first and second intervals being shorter than said one bit period of said input data pulse signal and separated from each other to leave a third interval therebetween;
   a phase comparator for comparing said sampling clock signal with said first and second comparison signals and producing a first error signal when said sampling clock signal occurs during said first interval and a second error signal when said sampling clock signal occurs during said second interval, said phase comparator producing no error signal when said sampling clock occurs during said third interval; and
   fourth means responsive to said first and second error signals for producing said phase control signal, whereby a predetermined phase relationship is maintained between said sampling clock signal and said input data pulse signal.

2. The circuit as claimed in claim 1, wherein said first means includes phase shift means responsive to said reference clock signal for producing a plurality of phase shifted clock signals and selection means responsive to said phase control signal for selecting one of said phase shifted clock signals, the selected phase shifted clock signal being employed as said sampling clock signal.

3. The circuit as claimed in claim 1, wherein said phase comparator includes a first flip-flop circuit having a clock terminal supplied with said sampling clock signal and a data terminal supplied with said first comparison signal and producing said first error signal, and a second flip-flop circuit having a clock terminal supplied with said sampling clock signal and a data terminal supplied with said second comparison signal and producing said second error signal.

4. The circuit as claimed in claim 3, wherein said fourth means includes a counter counting in a first direction in response to said first error signal and in a second direction in response to said second error signal.

5. A circuit as claimed in claim 1, wherein said second and third means together comprise means for generating a waveform shaped data pulse from said received data, means for generating a plurality of delayed versions of said waveform-shaped data pulse, means for combining said waveform-shaped data pulse with a selected one of said delayed versions of said waveform-shaped data pulse to generate said first comparison signal, and means for combining said waveform-shaped data pulse with a different one of said delayed versions of said waveform-shaped data pulse to generate said second comparison signal.

6. A circuit for maintaining a predetermined phase relationship between an input data pulse signal and a sampling clock signal, comprising:

a reference clock generator for generating a reference clock signal;

phase shift means responsive to said reference clock signal for producing a plurality of phase shifted clock signals;

first means responsive to said input data pulse signal for producing a first pulse signal from said input data pulse signal, the leading and trailing edges within one cycle period of said first pulse signal defining a first interval within each one bit period of said input data pulse signal;

second means responsive to said input data pulse signal for producing a second pulse signal from said input data pulse signal, the leading and trailing edges within one cycle period of said second pulse signal defining a second interval within each one bit period of said input data pulse signal, said first and second intervals being shorter than said one bit period of said input data pulse signal and separated from each other to leave a third interval therebetween;

third means responsive to a selection signal for selecting one of said phase shifted clock signals as said sampling clock signal;

first phase comparing means responsive to said sampling clock signal and said first pulse signal for producing a first error signal when one of the leading and trailing edges of said sampling clock signal appears during said first interval;

second phase comparing means responsive to said sampling clock signal and said second pulse signal for producing a second error signal when said one of the leading and trailing edges of said sampling clock signal appears during said second interval; and fourth means responsive to said first or second error signals for changing said selection signal, said third means selecting another phase shifted clock signal in response to the changed selection signal.

7. The circuit as claimed in claim 6, wherein said fourth means includes an up/down counter having an up terminal supplied with said first error signal and a down terminal supplied with said second error signal, the count value of said up/down counter being utilized as said selection signal.

8. A circuit for producing a sampling clock signal for sampling an input data pulse signal, comprising:

phase shift means responsive to said input data pulse signal for producing a plurality of phase shifted data pulse signals, logic gate means responsive to a selected one or ones of said phase shifted data pulse signals for producing first and second non-overlapping pulses during respective non-overlapping first and second intervals in each one bit cycle period of said input data pulse signal;

first phase comparing means responsive to said sampling clock signal and said first pulse for producing a first error signal when one of the leading and trailing edges of said sampling clock signal appears during said first interval;

a second phase comparing means responsive to said sampling clock signal and said second pulse for producing a second error signal when said one of the leading and trailing edges of said sampling clock signal appears during said second interval;

a reference clock generator generating a reference clock signal;

means responsive to said reference clock signal for producing said sampling clock signal, and means responsive to said first error signal for advancing the phase of said sampling clock signal and responsive to said second error signal for delaying the phase of said sampling clock signal, whereby said sampling clock signal and said input data signal maintain a predetermined phase relationship therebetween.

9. A digital phase lock loop circuit comprising:

a clock generator for generating a reference clock signal;

first phase shifting means responsive to said reference clock signal for producing a plurality of phase shifted clock signals;

selecting means responsive to a selection signal for selecting one of said phase shifted clock signals as a sampling clock signal;

second phase shifting means responsive to an input data pulse signal for producing a plurality of phase shifted data pulse signals, first logic gate means responsive to a first selected one or ones of said phase shifted data pulse signals for producing a first pulse signal, a first logic level period within one cycle period of said first pulse signal defining a first interval within each one bit period of said input data pulse signal;

second logic gate means responsive to a second selected one or ones of said phase shifted data pulse signals for producing a second pulse signal, the first logic level period within one cycle period of said second pulse signal defining a second interval within each one bit period of said input data pulse signal, the first logic level period of said first pulse signal being separated from the first logic level period of said second pulse signal to form a third interval within each one bit period of said input data pulse signal between said first and second intervals;

phase comparing means responsive to said sampling clock signal and said first and second pulse signals for producing a first error signal when one of the leading and trailing edges of said sampling clock signal appears during the first interval and a second error signal when said one of said leading and trailing edges of said sampling clock signal appears during the second interval, and means responsive to any one of said first and second error signals for changing said selection signal, whereby said selecting means selects another one of said phase shifted clock signals as said sampling signal to maintain a predetermined phase relationship between said sampling clock signal and said input data pulse signal.

10. The digital phase lock loop circuit as claimed in claim 9, wherein each of said first and second phase shifting means includes a phase delay line circuit having a plurality of taps each producing its respective phase shifted signal.

11. A circuit for producing a sampling clock signal for sampling an input data pulse signal, comprising:

a reference clock pulse generator for generating a reference clock pulse signal;

first means responsive to a phase control signal for producing a phase-shifted reference clock signal from said reference clock pulse signal to obtain a sampling clock signal;

second means responsive to a received data signal for generating normalized data signal pulses of uniform pulse width;

third means for producing a first comparison signal only during a first interval within each one bit period of said normalized data signal pulses;

fourth means for producing a second comparison signal only during a second interval within each one bit period of said input data pulse signal, said first and second intervals being shorter than said one bit period of said normalized data signal pulse and separated from each other to have a third interval therebetween;

a phase comparator for comparing said sampling clock signal with said first and second comparison signals and producing a first error signal when said sampling clock signal occurs during said first interval and a second error signal when said sampling clock signal occurs during said second interval, said phase comparator producing no error signal when said sampling clock occurs during said third interval; and fifth means responsive to said first and second error signals for producing said phase control signal, whereby a predetermined phase relationship is maintained between said sampling clock signal and said input data pulse signal.

* * * * *